United States Patent
Kato et al.

(10) Patent No.: US 11,569,074 B2
(45) Date of Patent: *Jan. 31, 2023

(54) GOLD SPUTTERING TARGET

(71) Applicant: TANAKA KIKINZOKU KOGYO K.K., Tokyo (JP)

(72) Inventors: Tetsuya Kato, Tomioka (JP); Yohei Mizuno, Tomioka (JP); Chiharu Ishikura, Tomioka (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 824 days.

This patent is subject to a terminal disclaimer.

(21) Appl. No.: 16/205,471

(22) Filed: Nov. 30, 2018

(65) Prior Publication Data

US 2019/0103257 A1    Apr. 4, 2019

Related U.S. Application Data

(63) Continuation of application No. PCT/JP2017/020617, filed on Jun. 2, 2017.

(30) Foreign Application Priority Data

Jun. 2, 2016  (JP) .............................. JP2016-111245

(51) Int. Cl.
  *H01J 37/34*     (2006.01)
  *C23C 14/34*     (2006.01)
  *C23C 14/14*     (2006.01)
  *C22F 1/00*      (2006.01)
  *C22F 1/14*      (2006.01)

(52) U.S. Cl.
  CPC .......... *H01J 37/3426* (2013.01); *C23C 14/14* (2013.01); *C23C 14/34* (2013.01); *C23C 14/3414* (2013.01); *C22F 1/00* (2013.01); *C22F 1/14* (2013.01)

(58) Field of Classification Search
  CPC ........ C23C 14/14; C23C 14/3414; C22F 1/14
  See application file for complete search history.

(56) References Cited

U.S. PATENT DOCUMENTS

| | | | |
|---|---|---|---|
| 4,808,373 A | 2/1989 | Hoffman et al. | |
| 2002/0153071 A1 | 10/2002 | Segal et al. | |
| 2006/0124456 A1 | 6/2006 | Murai | |
| 2015/0041313 A1 | 2/2015 | Komiyama | |
| 2016/0343553 A1* | 11/2016 | Maruko .................. | B21J 5/002 |

FOREIGN PATENT DOCUMENTS

| | | |
|---|---|---|
| CN | 1782121 A | 6/2006 |
| CN | 1266304 C | 7/2006 |
| CN | 103128303 A | 6/2013 |
| CN | 103726024 A | 4/2014 |
| CN | 104561639 A | 4/2015 |
| EP | 0 260 630 A2 | 3/1988 |
| JP | 61-127861 A | 6/1986 |
| JP | 62-172543 A | 7/1987 |
| JP | 10-195610 A | 7/1998 |
| JP | 2002-146521 A | 5/2002 |
| JP | 2003-328059 A | 11/2003 |
| JP | 2004-513228 A | 4/2004 |
| JP | 2006-161066 A | 6/2006 |
| JP | 2009-512779 A | 3/2009 |
| JP | 2013/204052 A | 10/2013 |
| RU | 2214476 C2 | 10/2003 |
| RU | 2469128 C2 | 12/2012 |
| SU | 547242 A1 | 2/1977 |
| WO | WO 2007/045387 A1 | 4/2007 |
| WO | WO-2008/037556 A2 | 4/2008 |
| WO | WO 2015/111563 A1 | 7/2015 |

OTHER PUBLICATIONS

Office Action dated Jun. 24, 2021, issued in corresponding Taiwanese Patent Application No. 106118251 (5 pages).
Second Office Action issued in Chinese Patent Application No. 201780032766.X dated Apr. 6, 2021.
Migaku Takahashi et al., Sputtering Target for Information Network Devices Present and Future, Journal of the Vacuum Society of Japan, vol. 50, No. 1, 2007, 22-27, 7 pages.
Japanese Office Action and English translation, Application No. 2018-521015, dated Apr. 6, 2021, 8 pages.
H. Tsuge et al., Angular Distribution of Sputtered Atoms from Polycrystalline Metal Targets, Journal of Applied Physics, 1981, vol. 52, No. 7, pp. 4391-4395.
Chinese Office Action and English translation, Application No. 201780032766X, dated Aug. 18, 2020, 11 pages.
Japanese Office Action and English translation, Application No. 2018-521015, dated Sep. 15, 2020, 6 pages.
Office Action dated Oct. 4, 2021 issued in a corresponding Russian Patent Application No. 2018146163/05, (11 pages).

\* cited by examiner

*Primary Examiner* — Jophy S. Koshy
*Assistant Examiner* — Joshua S Carpenter
(74) *Attorney, Agent, or Firm* — Foley & Lardner LLP

(57) ABSTRACT

A gold sputtering target is made of gold and inevitable impurities, and has a surface to be sputtered. In the gold sputtering target, an average value of Vickers hardness is 40 or more and 60 or less, and an average crystal grain size is 15 μm or more and 200 μm or less. A {110} plane of gold is preferentially oriented at the surface to be sputtered.

7 Claims, No Drawings

GOLD SPUTTERING TARGET

CROSS-REFERENCE TO RELATED APPLICATIONS

This application is a continuation of prior International Application No. PCT/JP2017/020617, filed on Jun. 2, 2017 which is based upon and claims the benefit of priority from Japanese Patent Applications No. 2016-111245 filed on Jun. 2, 2016; the entire contents of all of which are incorporated herein by reference.

FIELD

Embodiments described herein generally relate to a gold sputtering target.

BACKGROUND

An Au film deposited by using a gold (Au) sputtering target has been used in various fields owing to excellent chemical stability and electric properties of Au in itself. In a quartz oscillator device, an Au sputtering film is used, for example, as excitation electrodes which are formed at both surfaces of a quartz chip. In the quartz oscillator device, an Au sputtering target capable of depositing the Au film with a uniform film thickness distribution at a sputtering is demanded because a vibration frequency is adjusted by a film thickness of the Au film, and the like.

Regarding a shape of the sputtering target, a plate-shaped sputtering target such as a disc-shape or a rectangular-shape used for a planar magnetron sputtering is generally known. In addition, a cylindrical sputtering target is also known. The cylindrical sputtering target is started to be spread to a ceramics material target or the like, and a spread to a metallic/alloy-based target is also in progress, further application for a noble metal target such as silver (Ag) is also studied, because a usage rate of a target material at the sputtering increases compared to the plate-shaped sputtering target (refer to References 1, 2).

In the Au sputtering target used for the deposition of the Au film, it is studied to use not only the plate-shaped target but also the cylindrical target. However, in the conventional Au sputtering target, it is difficult to satisfy the uniformity of the film thickness distribution which is required for the Au film used as the electrode of the quartz oscillator device in both the plate-shaped target and the cylindrical target. In particular, the cylindrical Au sputtering target is difficult to increase the uniformity of the film thickness distribution of the Au film resulting from processing into the cylindrical shape.

In more detail, the quartz oscillator device is used for portable equipment or the like, and reduction in size, weight, thickness, and so on of the quartz oscillator device in itself are demanded according to requirement for reduction in size, weight, thickness, and so on of the portable equipment. For example, a package size of the quartz oscillator device has been reduced from 5.0×3.2 mm (5032 size) to 3.2×2.5 mm (3225 size), 2.5×2.0 mm (2520 size), 2.0×1.6 mm (2016 size), 1.6×1.2 mm (1612 size), and the quartz oscillator (quartz chip) in itself has been also reduced in size according thereto.

As described above, the quartz oscillator device is constituted by forming the Au films on both surfaces of the quartz chip (blank) as electrodes. An outer shape of the quartz chip is shaped by etching to round off corners, or the corners are mechanically rounded when the quartz chip is punched by pressing, and thereby, a frequency is stabilized by centering the gravity center. Since a rough surface of the quartz chip has adverse effects on frequency characteristics, high smoothness is desired. The high smoothness, that is, small variation in a film thickness is desired also in the electrodes formed on the quartz chip. The electrode has a three-dimensional structure having a thickness, and an effect of the variation in the film thickness exerted on a three-dimensional shape becomes larger as the quartz chip becomes smaller in size. Accordingly, it is demanded to further reduce the variation in the film thickness of the Au film which is applied to the electrode in accordance with the reduction in size of the quartz oscillator device or the like.

In a quartz oscillator with the frequency of 32 kHz used for clocks, an effect of variation in mass of the Au film exerted on the frequency characteristics is large. A shape which is called a fork-type or a tuning-fork-type is applied to the quartz oscillator with the frequency of 32 kHz. Though the tuning-fork-type quartz oscillator is suitable for reduction in size, it is strongly demanded to reduce variation in mass based on the variation in film thickness of the Au film because the variation in mass of the Au film affects on the frequency characteristics. Since the frequency of the tuning-fork-type quartz oscillator is difficult to be adjusted, various measures have been taken. For example, a forming method of the Au film shifts from a vapor deposition method to a sputtering method. After the Au film is formed through the sputtering method, a part of the Au film is removed by a laser beam to adjust the mass, or when the Au film is formed through the sputtering method, a weight to adjust the mass is formed. Under these circumstances, it is possible to drastically reduce labor spent on the adjustment of the frequency if the mass variation based on the film thickness variation of the Au film can be reduced. In particular, since the effect of the film thickness variation becomes larger as the quartz oscillator becomes smaller in size, the mass easily varies. It is demanded to reduce the film thickness variation of the Au sputtering film also from the context as stated above.

SUMMARY

An object of the present invention is to provide a gold sputtering target capable of increasing uniformity of a film thickness distribution of an Au film.

A gold sputtering target according to the present invention is characterized in that a gold sputtering target made of gold and inevitable impurities, and having a surface to be sputtered, where an average value of the Vickers hardness is 40 or more and 60 or less, an average crystal grain size is 15 μm or more and 200 μm or less, and a {110} plane of gold is preferentially oriented at the surface.

Effect of the Invention

A gold film excellent in uniformity of a film thickness distribution can be reproducibly obtained by performing sputtering deposition using a gold sputtering target of the present invention.

DETAILED DESCRIPTION

Hereinafter, embodiments of the present invention are described. A sputtering target of the embodiment is made of gold (Au) and inevitable impurities. The inevitable impurities other than Au contained in the Au sputtering target are not particularly limited. Purity of Au in the sputtering target is set according to a usage of the target and usage of a film formed by using the target, and the Au purity is set to, for example, 99.99% or more. A high-purity Au film can be obtained by using the sputtering target with the Au purity of 99.99% or more.

A shape of the Au sputtering target of the embodiment is not particularly limited, and may be either a plate-shaped or cylindrical target. Examples of representative shapes of the plate-shaped sputtering target include a polygon plate or the like such as, for example, a disc or rectangular plate. In addition, for example, the shape may be one where a part of the disc plate or polygon plate is bored to form a hollow part, one where an inclined part, a projection, a depression, and so on are provided at a part of a surface of the disc plate or a polygon plate, and the shape is not particularly limited. A shape of the cylindrical sputtering target is not particularly limited, and the shape or the like according to the sputtering equipment is applied. An example of a representative shape of the cylindrical sputtering target includes, for example, a shape with an outside diameter of 170 to 50 mm, an inside diameter of 140 to 20 mm, and a length of 100 to 3000 mm. The Au sputtering target has a surface to be sputtered (sputtering surface). In a case of the plate-shaped sputtering target, a surface of the plate becomes the sputtering surface, and in a case of the cylindrical sputtering target, a surface of a cylinder (cylindrical surface) becomes the sputtering surface.

The Au sputtering target of the embodiment has the Vickers hardness of 40 or more and 60 or less. The Au film excellent in the uniformity of the film thickness distribution can be deposited by performing the sputtering deposition by using the Au sputtering target having the Vickers hardness as stated above. That is, when the Vickers hardness of the Au sputtering target exceeds 60 HV, it means that strain generated at a manufacturing time remains in the sputtering target. In such a case, particles do not uniformly fly from the target at the sputtering, resulting in that the uniformity of the film thickness distribution is damaged. The Vickers hardness of the Au sputtering target is preferably 55 HV or less. When it is heated at the sputtering, hardness and a crystal grain size change, to lower the flying uniformity of the particles. On the other hand, when the Vickers hardness of the Au sputtering target is less than 40 HV, it is thought that crystal orientation according to a generation of a grain growth of crystals begins to be destroyed, resulting in that the uniformity of the film thickness distribution is damaged. The Vickers hardness of the Au sputtering target is preferably 45 HV or more.

The Vickers hardness of the Au sputtering target is measured as described below. In the case of the plate-shaped sputtering target, measurement locations are nine locations in total of three locations at intervals of 10 mm on an arbitrary straight line of a sputtering surface (a surface to be sputtered), three locations in total of one location each from regions divided into three parts in a thickness direction of a first cross-section which is orthogonal to the sputtering surface (three locations in total at intervals of 1.5 mm on the straight line in the thickness direction with respect to a sample with a thickness of 5 mm in examples), and three locations in total of one location each from regions divided into three parts in a thickness direction of a second cross-section which is in a right angle to the sputtering surface and the first cross-section (three locations in total at intervals of 1.5 mm on the straight line in the thickness direction with respect to a sample with a thickness of 5 mm in examples). The Vickers hardness at each measurement location is measured with a test force (pressing load) of 200 gf. An average value of the Vickers hardness ($HV_{av1}$) at the sputtering surface, an average value of the Vickers hardness ($HV_{av2}$) at the first cross-section, and an average value of the Vickers hardness ($HV_{av3}$) at the second cross-section are calculated. These respective average values ($HV_{av1}$, $HV_{av2}$, $HV_{av3}$) of the sputtering surface, the first cross-section, and the second cross-section are averaged, and the value is set as an average value of the Vickers hardness ($HV_{tav}$) as a whole of the plate-shaped Au sputtering target.

In the plate-shaped Au sputtering target, it is preferable that a ratio ($HV_{av1}/HV_{tav}$) of the average value of the Vickers hardness ($HV_{av1}$) of the sputtering surface with respect to the Vickers hardness ($HV_{tav}$) as the whole target, a ratio ($HV_{av2}/HV_{tav}$) of the average value of the Vickers hardness ($HV_{av2}$) of the first cross-section with respect to the Vickers hardness ($HV_{tav}$) as the whole target, and a ratio ($HV_{av3}/HV_{tav}$) of the average value of the Vickers hardness ($HV_{av3}$) of the second cross-section with respect to the Vickers hardness ($HV_{tav}$) as the whole target are respectively in a range of 0.8 to 1.2. That is, variation in the Vickers hardness of the Au sputtering target preferably falls within ±20%. A flying direction of particles at the sputtering is more uniformed, and the uniformity of the film thickness distribution is further improved by making the variation in the Vickers hardness at each part of the Au sputtering target small.

When the Au sputtering target is the cylindrical sputtering target, measurement locations are nine locations in total of three locations at intervals of 10 mm on an arbitrary first straight line in parallel to a cylinder axis at the sputtering surface (cylindrical surface), three locations at intervals of 10 mm on a second straight line which is rotated by 90° from the first straight line, and three locations in total of one location each from regions divided into three parts in a thickness direction of a cross-section which is orthogonal to the cylinder axis (three locations in total at intervals of 1.5 mm on the straight line in the thickness direction with respect to a sample with a thickness of 5 mm in examples). The Vickers hardness at each measurement location is measured with a test force (pressing load) of 200 gf. An average value of the Vickers hardness ($HV_{av1}$) on the first straight line on the sputtering surface, an average value of the Vickers hardness ($HV_{av2}$) on the second straight line, and an average value of the Vickers hardness ($HV_{av3}$) at the cross-section are calculated. These respective average values ($HV_{av1}$, $HV_{av2}$, $HV_{av3}$) of the sputtering surface and the cross-section are further averaged, and the value is set as an average value of the Vickers hardness ($HV_{tav}$) as a whole of the cylindrical Au sputtering target.

In the cylindrical Au sputtering target, it is preferable that a ratio ($HV_{av1}/HV_{tav}$) of the average value of the first Vickers hardness ($HV_{av1}$) of the sputtering surface with respect to the Vickers hardness ($HV_{tav}$) as the whole target, a ratio ($HV_{av2}/HV_{tav}$) of the average value of the second Vickers hardness ($HV_{av2}$) of the sputtering surface with respect to the Vickers hardness ($HV_{tav}$) as the whole target, and a ratio ($HV_{av3}/HV_{tav}$) of the average value of the Vickers hardness ($HV_{av1}$) at the cross-section with respect to the Vickers hardness ($HV_{tav}$) as the whole target are respectively in a range of 0.8 to 1.2. That is, variation in the Vickers hardness of the Au sputtering target preferably falls within ±20%. A flying direction of particles at the sputtering is more uniformed, and the uniformity of the film thickness distribution is further improved by making the variation in the Vickers hardness at each part of the cylindrical Au sputtering target small. In the cylindrical Au sputtering target, the uniformity of the film thickness distribution can be improved by making the variation in the Vickers hardness at each part of the sputtering surface (cylinder surface) small because a whole of the cylinder surface is sputtered while rotating the cylindrical target.

In the Au sputtering target of the embodiment, an average crystal grain size is preferably 15 μm or more and 200 μm or less. The sputtering deposition is performed by using the Au sputtering target having the average crystal grain size, resulting in further increasing the uniformity of the film thickness distribution of the Au film. That is, when the average crystal grain size of the Au sputtering target is less than 15 μm, the flying of the particles from the target becomes nonuniform at the sputtering to cause that the uniformity of the film thickness distribution is damaged. The average crystal grain size of the Au sputtering target is preferably 30 μm or more. Meanwhile, when the average crystal grain size of the Au sputtering target exceeds 200 μm, a flying property of the particles at the sputtering is lowered to cause that the uniformity of the film thickness distribution is damaged. The average crystal grain size of the Au sputtering target is more preferably 150 μm or less.

The average crystal grain size of the Au sputtering target is measured as described below. In the case when the Au sputtering target is the plate-shaped sputtering target, measurement locations are nine locations in total of three locations at intervals of 10 mm on an arbitrary straight line of the sputtering surface, three locations in total of one location each from regions divided into three parts in a thickness direction of the first cross-section which is orthogonal to the sputtering surface (three locations in total at intervals of 1.5 mm on the straight line in the thickness direction with respect to the sample with the thickness of 5 mm in examples), and three locations in total of one location each from regions divided into three parts in the thickness direction of the second cross-section which is in the right angle to the sputtering surface and the first cross-section (three locations in total at intervals of 1.5 mm on the straight line in the thickness direction with respect to the sample with the thickness of 5 mm in examples). A macrophotograph of each measurement location is taken with an optical microscope. A magnification of the photograph is set to a magnification which is easy to measure the crystal grain size, for example, 50 magnification or 100 magnification. Straight lines are vertically and horizontally drawn so as to pass through a center of the macrophotograph, and the number of crystal grains which are cut with each straight line is counted. The crystal grain at an end of a line segment is counted as 0.5. Lengths of the vertical and horizontal straight lines are respectively divided by the number of crystal grains to find vertical and horizontal average grain sizes, and an average value of these values is set as an average grain size of one sample.

An average value of the crystal grain size ($AD_{av1}$) at the sputtering surface, an average value of the crystal grain size ($AD_{av2}$) at the first cross-section, and an average value of the crystal grain size ($AD_{av3}$) at the second cross-section are respectively calculated. These average values of the crystal grain sizes ($AD_{av1}$, $AD_{av2}$, $AD_{av3}$) at the sputtering surface, the first cross-section, and the second cross-section are further averaged, to set the value as an average crystal grain size ($AD_{tav}$) of the plate-shaped Au sputtering target as a whole.

At the plate-shaped Au sputtering target, it is preferable that a ratio ($AD_{av1}/AD_{tav}$) of the average crystal grain size ($AD_{av1}$) of the sputtering surface with respect to the average crystal grain size ($AD_{tav}$) as the whole target, a ratio ($AD_{av2}/AD_{tav}$) of the average crystal grain size ($AD_{av2}$) at the first cross-section with respect to the average crystal grain size ($AD_{tav}$) as the whole target, and a ratio ($AD_{av3}/AD_{tav}$) of the average crystal grain size ($AD_{av3}$) at the second cross-section with respect to the average crystal grain size ($AD_{tav}$) as the whole target are respectively in a range of 0.8 to 1.2. That is, variation in the average crystal grain size of the Au sputtering target preferably falls within ±20%. A flying direction of particles at the sputtering is more uniformed, and the uniformity of the film thickness distribution is further improved by making the variation in the average crystal grain size at each part of the Au sputtering target small.

In the case when the Au sputtering target is the cylindrical sputtering target, measurement locations are nine locations in total of three locations at intervals of 10 mm on the arbitrary first straight line in parallel to the cylinder axis at the sputtering surface (cylindrical surface), three locations at intervals of 10 mm on the second straight line which is rotated by 90° from the first straight line, and three locations in total of one location each from regions divided into three parts in the thickness direction of the cross-section which is orthogonal to the cylinder axis (three locations in total at intervals of 1.5 mm on the straight line in the thickness direction with respect to the sample with the thickness of 5 mm in examples). An average value of the crystal grain size ($AD_{av1}$) on the first straight line of the sputtering surface, an average value of the crystal grain size ($AD_{av2}$) on the second straight line, and an average value of the crystal grain size ($AD_{av3}$) at the cross-section are respectively calculated. These average values ($AD_{av1}$, $AD_{av2}$, $AD_{av3}$) at the sputtering surface and the cross-section are further averaged, to set the value as an average crystal grain size ($AD_{tav}$) of the cylindrical Au sputtering target as a whole.

At the cylindrical Au sputtering target, it is preferable that a ratio ($AD_{av1}/AD_{tav}$) of the first average crystal grain size ($AD_{av1}$) of the sputtering surface with respect to the average crystal grain size ($AD_{tav}$) as the whole target, a ratio ($AD_{av2}/AD_{tav}$) of the second average crystal grain size ($AD_{av2}$) of the sputtering surface with respect to the average crystal grain size ($AD_{tav}$) as the whole target, and a ratio ($AD_{av3}/AD_{tav}$) of the average crystal grain size ($AD_{av3}$) at the cross-section with respect to the average crystal grain size ($AD_{tav}$) as the whole target are respectively in a range of 0.8 to 1.2. That is, variation in the average crystal grain size of the Au sputtering target preferably falls within ±20%. The flying direction of the particles at the sputtering is more uniformed, and the uniformity of the film thickness distribution is further improved by making the variation in the average crystal grain size at each part of the cylindrical Au sputtering target small. In the cylindrical Au sputtering target, the uniformity of the film thickness distribution can be further improved by making the variation in the average crystal grain size at each part of the sputtering surface (cylinder surface) small because the whole of the cylinder surface is sputtered while rotating the cylindrical target.

At the Au sputtering target of the embodiment, it is preferable that a {110} plane of Au is preferentially oriented at the sputtering surface. Au has a face-centered cubic structure, and the {110} plane from among crystal planes forming the structure is likely to be sputtered compared to other crystal planes. Since the flying direction of the particles at the sputtering becomes stable by preferentially orienting the {110} plane at the sputtering surface, the uniformity of the film thickness distribution can be further improved. Here, a state where the sputtering surface is preferentially oriented to the {110} plane means that the sputtering surface of the Au sputtering target is subjected to X-ray diffraction, an orientation index N of each crystal plane is found through the following Wilson's expression (1) from a diffraction intensity ratio of each crystal plane of Au, and the orientation index N of the {110} plane is larger than 1 and the largest among the orientation indexes N of all crystal planes. The orientation index N of the {110} plane of Au is more preferably 1.3 or more.

[Mathematical expression 1]

$$N = \left( \frac{\frac{I/I_{(hkl)}}{\Sigma(I/I_{(hkl)})}}{\frac{JCPDS \cdot I/I_{(hkl)}}{\Sigma(JCPDS \cdot I/I_{(hkl)})}} \right) \quad (1)$$

In the expression (1), $I/I_{(hkl)}$ is the diffraction intensity ratio of an (hkl) plane in the X-ray diffraction, $JCPDS \cdot I/I_{(hkl)}$ is the diffraction intensity ratio of the (hkl) plane at a JCPDS (joint committee for powder diffraction standards) card, $\Sigma(I/I_{(hkl)})$ is a sum of the diffraction intensity ratios of all crystal planes in the X-ray diffraction, and $\Sigma(JCPDS \cdot I/I_{(hkl)})$ is a sum of the diffraction intensity ratios of all crystal planes at the JCPDS card.

The Au sputtering target of the embodiment enables remarkable improvement in the uniformity of the film thickness distribution of the Au sputtering film based on a combination of the Vickers hardness of 40 or more and 60 or less, the average crystal grain size of 15 μm or more and 200 μm or less, and the preferential orientation of the {110} plane of Au at the sputtering surface. That is, respective effects of the Vickers hardness, the average crystal grain size, and the Au preferential orientation plane synergistically acts on improvement in the flying property and the uniformity of particles at the sputtering, and further stability in the flying direction of the particles. When the Au sputtering film is applied to, for example, electrodes or the like of an electronic device such as a quartz oscillator device which has been reduced in size, it becomes possible to provide an Au film with little film thickness variation and mass variation based on the film thickness variation, and excellent in uniformity in the film thickness distribution and the mass distribution.

A manufacturing method of the Au sputtering target of the above-described embodiment is not particularly limited. For example, the plate-shaped Au sputtering target can be produced through a manufacturing method combining casting, cutting, forging, and heat treatment of Au raw material. Rolling may be applied instead of forging of the Au raw material in the case of the plate-shaped Au sputtering target. The cylindrical Au sputtering target can be produced through a manufacturing method combining casting, cutting, pipe processing, and heat treatment of the Au raw material. Examples of the pipe processing include an extrusion process such as a Raflo method, a drawing process, a forging process, and so on. The above-described Vickers hardness, the average crystal grain size, the preferential crystal plane, and so on can be obtained by controlling a reduction ratio and a heat treatment temperature in each processing.

The casting process of the Au raw material is preferably performed by dissolving the Au raw material in a graphite crucible in a vacuum atmosphere or an inert atmosphere, or dissolving in a graphite crucible while spraying inert gas on a molten metal surface by using an atmosphere melting furnace or while covering the molten metal surface with a carbon-based solid sealing material and casting into a mold made of graphite or cast iron. Next, surface defects on an outer peripheral surface of a cast Au ingot are ground and removed. Au purity of the Au ingot is preferably 99.99% or more (4N or more).

When the plate-shaped Au sputtering target is produced, the Au ingot is cast into a desired plate shape. The forging process of the Au ingot is preferably performed in a hot range of 200 to 800° C., and preferably performed such that a reduction ratio (a cross-section decrease rate or a thickness decrease rate) is 50% or more and 90% or less. The forging processes may be performed for a plurality of times, and heat treatment may be performed in a middle thereof. When the forging processes are performed for a plurality of times, the reduction ratio is a reduction ratio as a whole. By setting the reduction ratio of the forging process to 50% or more, a cast structure is broken and a uniform recrystallization structure is likely to be obtained, and controllability and uniformity in hardness and a crystal grain size in a subsequent heat treatment process can be increased. An Au forged product may be subjected to a cold-rolling process according to need. A reduction ratio of the rolling process is preferably 50% or more and 90% or less though it depends on the reduction ratio at the forging time. Further, the rolling process may be applied to the processing of the Au ingot instead of the forging process. The rolling process of the Au ingot is preferably performed in the hot range of 200 to 800° C. as same as the forging process, and a reduction ratio (a cross-section decrease rate or a thickness decrease rate) is in the range of 50 to 90%.

When the cylindrical Au sputtering target is produced, a columnar-formed Au billet is processed into a pipe-shape through the extrusion process such as the Raflo method, the drawing process, the forging process, and so on. When the extrusion process such as the Raflo method is applied, the extrusion process is preferably performed in the cold, and an outside diameter and a wall thickness of the pipe are controlled by a shape of a die (an inside diameter or the like) and a shape of a mandrel (an outside diameter or the like). At this time, an extrusion ratio (the outside diameter of the billet/the outside diameter of the pipe) is preferably adjusted to be 1.5 or more and 3.0 or less. By setting the extrusion ratio to 1.5 or more, the cast structure is broken and the uniform recrystallization structure is likely to be obtained, and the controllability and the uniformity of hardness in the subsequent heat treatment process can be increased. When the extrusion ratio exceeds 3.0, an internal strain becomes too large, and cracks and wrinkling are likely to occur.

When the drawing process is applied, an Au element tube produced through the extrusion process, a digging process, and the like is preferably processed into a desired pipe-shape by drawing in the cold, and the outside diameter and the wall thickness of the pipe are controlled through the shape of the die (the inside diameter or the like) and a shape of a plug (the outside diameter or the like). At this time, the reduction ratio per one time is preferably adjusted to 2% or more and 5% or less. The drawing processes may be performed for a plurality of times, and in such a case, a sum of the reduction ratios is preferably adjusted to 50% or more and 90% or less. By setting the sum of the reduction ratios to 50% or more, the cast structure is broken and the uniform recrystallization structure is likely to be obtained, and the controllability and the uniformity of hardness in the subsequent heat treatment process can be increased.

When the forging process is applied, the Au element tube produced through the extrusion process, the digging process and the like is preferably hot-forged in a temperature range of 200 to 800° C. to process into a desired pipe shape, and the outside diameter and the wall thickness of the pipe are controlled by the reduction ratio at the forging time. The forging process is preferably performed by adjusting the reduction ratio to 30% or more and 80% or less. By setting the reduction ratio to 30% or more, the cast structure is broken and the uniform recrystallization structure is likely to be obtained, and the controllability and the uniformity of hardness in the subsequent heat treatment process can be increased. When the reduction ratio exceeds 80%, the internal strain becomes too large, and the cracks and the wrinkling are likely to occur.

Next, a metal structure of a target material is recrystallized by performing the heat treatment of the plate-shaped target material which is produced through the forging process or the rolling process and the pipe-shaped target material which is produced through the pipe processing in, for example, the atmosphere or the inert gas atmosphere at a temperature of 200° C. or more and 500° C. or less. The Au sputtering target having the Vickers hardness of 40 or more and 60 or less can be obtained through the heat treatment. Further, the Au sputtering target having the average crystal grain size of 15 μm or more and 200 μm or less and the Au sputtering target where the sputtering surface is preferentially oriented into the {110} plane can be obtained. The heat treatment processes may be performed for a plurality of times. After the heat treatment process, a process to regulate a shape of the sputtering target may be performed through the cutting process or the like according to need.

When the heat treatment temperature is less than 200° C., the internal strain generated at the process time cannot be sufficiently removed, and there is a possibility that the Vickers hardness exceeds 60. Further, there is a possibility that the average crystal grain size becomes less than 15 μm or the sputtering surface cannot be preferentially oriented into the {110} plane because the metal structure of the target material cannot be sufficiently recrystallized. Meanwhile, when the heat treatment temperature exceeds 500° C., there is a possibility that the Vickers hardness becomes less than 40. Further, there is a possibility that the average crystal grain size exceeds 200 μm because the recrystallization structure grows too much or the sputtering surface is preferentially oriented into the crystal plane other than the {110} plane. A retention time at the heat treatment temperature (heat treatment time) is preferably set to, for example, 10 minutes or more and 120 minutes or less. When the heat treatment time is too short, there is a possibility that the removal of strains is insufficient or the metal structure cannot be sufficiently recrystallized. Meanwhile, when the heat treatment time is too long, there is a possibility that the Vickers hardness is lowered too much, or the average crystal grain size becomes too large.

As stated above, the Au sputtering target whose Vickers hardness is 40 or more and 60 or less, with small variation in the Vickers hardness can be obtained by controlling the reduction ratios of the step processing the Au ingot into the plate-shape or the cylindrical-shape and the temperature of the recrystallization heat treatment process. Further, the Au sputtering target whose average crystal grain size is 15 μm or more and 200 μm or less, with the small variation in the average crystal grain size, or the Au sputtering target whose sputtering surface is preferentially oriented into the {110} plane can be obtained. By depositing the Au film while using the Au sputtering target as stated above, the Au film satisfying the uniformity in the film thickness distribution which is required for, for example, the electrode of the quartz oscillator device or the like can be obtained. The Au sputtering target of this invention can be used for the deposition of an Au film applied to various electronic components without being limited to the electrode film (Au film) of the quartz oscillator device.

EXAMPLES

Next, concrete examples of the present invention and evaluation results thereof are described.

Example 1

First, an Au nugget was inserted into a graphite crucible to be dissolved. An Au molten metal was cast into a graphite mold to produce an Au ingot. An Au billet (purity: 99.99%) with a width of 190 mm, a length of 270 mm, and a thickness of 50 mm was produced by cutting and removing a surface of the Au ingot. Next, the Au billet was hot-forged at a temperature of 800° C. to obtain an Au target material with a width of 70 mm, a length of 200 mm, and a thickness of 45 mm. Reduction ratios at the forging time in three-axes directions were set to 80%. The Au target material after the forging was heat treated at a temperature of 500° C. for 30 minutes. The Au target material after the heat treatment was subjected to the cutting process to produce the disc-shaped Au sputtering target with a diameter of 152.4 mm and a thickness of 5 mm. Two Au sputtering targets were produced for a property measurement at each part and film thickness property measurement. It is the same as for the following examples and comparative examples.

The Vickers hardness of the obtained Au sputtering target was measured according to the measurement method of the plate-shaped sputtering target. The Vickers hardness at each measurement location was measured with the test force (pressing load) of 200 gf, resulting in that the average value of the Vickers hardness ($HV_{av1}$) at the sputtering surface was 50.5, the average value of the Vickers hardness ($HV_{av2}$) at the first cross-section was 52.1, the average value of the Vickers hardness ($HV_{av3}$) at the second cross-section was 51.6, and the average value of these values (the Vickers hardness ($HV_{tav}$) as the whole target) was 51.4. The ratios of the Vickers hardnesses ($HV_{av1}$, $HV_{av2}$, $HV_{av3}$) of respective parts with respect to the Vickers hardness ($HV_{tav}$) as the whole target were as follows: $HV_{av1}/HV_{tav}$ was 0.98; $HV_{av2}/HV_{tav}$ was 1.01; $HV_{av3}/HV_{tav}$ was 1.00.

Further, the average crystal grain size of the Au sputtering target was measured according to the measurement method of the plate-shaped sputtering target. As a result, the average crystal grain size ($AD_{tav}$) as the whole target was 34.2 μm. The sputtering surface of the Au sputtering target was subjected to the X-ray diffraction, and the crystal plane which was preferentially oriented was evaluated according to the above-stated method. As a result, it was verified that the {110} plane of Au was preferentially oriented at the sputtering surface. When the orientation index N of the {110} plane was found according to the above-stated method, the orientation index N of the {110} plane was 1.32. The Au sputtering target was subjected to a later-described deposition process to evaluate properties.

Examples 2 to 5, Comparative Examples 1 to 2

The Au billet produced similarly to Example 1 was used to produce the Au target material by performing the forging process similar to Example 1 except that each reduction ratio illustrated in Table 1 was applied. Next, the Au target material after the forging was subjected to the heat treatment under each condition illustrated in Table 1. After that, the Au target material after the heat treatment was subjected to the cutting process to produce the Au sputtering target having the same shape as Example 1. The Vickers hardness, the average crystal grain size, the preferentially oriented plane of the sputtering surface, and the orientation index N of the {110} plane of the Au sputtering targets were measured and evaluated similarly to Example 1. These measurement results are illustrated in Table 2. Each Au sputtering target was subjected to a later-described deposition process to evaluate the properties.

TABLE 1

| | | REDUCTION RATIO AT FORGING | HEAT TREATMENT CONDITION | |
| --- | --- | --- | --- | --- |
| | Au PURITY [%] | PROCESS TIME [%] | TEMPER-ATURE [° C.] | TIME [minutes] |
| EXAMPLE 1 | 99.99 | 80 | 500 | 30 |
| EXAMPLE 2 | 99.99 | 80 | 500 | 60 |
| EXAMPLE 3 | 99.99 | 80 | 500 | 90 |
| EXAMPLE 4 | 99.99 | 80 | 400 | 30 |
| EXAMPLE 5 | 99.99 | 80 | 300 | 30 |
| COMPAR-ATIVE EXAMPLE 1 | 99.99 | 80 | 100 | 30 |
| COMPAR-ATIVE EXAMPLE 2 | 99.99 | 80 | 600 | 30 |

TABLE 2

| | VICKERS HARDNESS * | | | | AVERAGE CRYSTAL GRAIN SIZE [μm] | PREFERRED CRYSTAL PLANE | ORIENTATION INDEX N OF {110} PLANE |
| --- | --- | --- | --- | --- | --- | --- | --- |
| | $HV_{tav}$ | $HV_{av1}$ | $HV_{av2}$ | $HV_{av3}$ | $AD_{tav}$ | | |
| EXAMPLE 1 | 51.4 | 50.5 (0.98) | 52.1 (1.01) | 51.6 (1.00) | 34.2 | {110} | 1.32 |
| EXAMPLE 2 | 49.3 | 49.1 (1.00) | 48.6 (0.99) | 50.1 (1.02) | 35.0 | {110} | 1.44 |
| EXAMPLE 3 | 48.3 | 48.5 (1.00) | 49.2 (1.01) | 48.3 (1.02) | 37.8 | {110} | 1.38 |
| EXAMPLE 4 | 53.6 | 52.3 (0.98) | 55.2 (1.03) | 53.2 (0.99) | 38.2 | {110} | 1.45 |
| EXAMPLE 5 | 55.6 | 56.3 (1.01) | 55.4 (1.00) | 55.1 (0.99) | 37.5 | {110} | 1.41 |
| COMPARATIVE EXAMPLE 1 | 77.3 | 77.2 (1.00) | 78.5 (1.02) | 76.1 (0.98) | — | — | — |
| COMPARATIVE EXAMPLE 2 | 34.9 | 35.1 (1.01) | 33.5 (0.96) | 36.1 (1.03) | 630.1 | — | — |

* A value in parentheses is a ratio with respect to $HV_{tav}$.

Each of Au sputtering targets obtained according to the above-stated Examples 1 to 5 and Comparative examples 1 to 2 was attached to a single-wafer sputtering equipment, and after an inside of the apparatus was evacuated to $1 \times 10^{-3}$ Pa or less, an Au film was deposited on a 6-inch Si substrate (wafer) by performing the sputtering under conditions of Ar gas pressure: 0.4 Pa, input power: DC100 W, distance between target and substrate: 40 mm, sputtering time: 5 minutes. A film thickness distribution of the obtained Au film was evaluated as described below. The substrate where the Au film was deposited was attached to the fluorescence X-ray film thickness meter, and the film thickness of the Au film was measured under conditions of measurement time: 60 seconds, the number of repeated measurement times: 10 times, measurement start point: substrate end part, measurement point interval: 5 mm. Measurement axes of the film thickness were four axes, that is, vertical and horizontal two axes which pass through a center of the substrate, vertical and horizontal two axes which pass through the center of the substrate under a state rotated by 45 degrees. After the measurement, a 10 points average film thickness of the respective measurement points is calculated, standard deviations of the measurement values at the same measurement positions of the four axes were calculated, and an average value of the standard deviations at all measurement positions was calculated. This value is illustrated in Table 3 as a standard deviation a of the film thickness. Next, a resistance value of the Au film was measured through a four probe method, and a standard deviation a of the resistance value was found similar to the film thickness. A result thereof is illustrated as the standard deviation a of the resistance value of the Au film in Table 3.

TABLE 3

| | DEPOSITION EVALUATION RESULT | |
| --- | --- | --- |
| | FILM THICKNESS σ | RESISTANCE VALUE σ |
| EXAMPLE 1 | 8.2 | 5.2 |
| EXAMPLE 2 | 7.9 | 4.6 |
| EXAMPLE 3 | 8.9 | 5.9 |
| EXAMPLE 4 | 9.1 | 6.1 |
| EXAMPLE 5 | 8.6 | 6.9 |
| COMPARATIVE EXAMPLE 1 | 14.0 | 10.6 |

TABLE 3-continued

| | DEPOSITION EVALUATION RESULT | |
| --- | --- | --- |
| | FILM THICKNESS σ | RESISTANCE VALUE σ |
| COMPARATIVE EXAMPLE 2 | 20.0 | 15.2 |

As it is obvious from Table 3, in each of the Au sputtering targets of Examples 1 to 5, the Vickers hardness is in the range of 40 to 60 and the variation in the Vickers hardness at each part is small. It can be seen that the average crystal grain size is in the range of 15 to 200 μm, the {110} plane is preferentially oriented at the sputtering surface, and the orientation index N of the {110} plane is larger than 1. It can be seen that the Au film which is sputtering deposited by using the Au sputtering target where the Vickers hardness, the average crystal grain size, and the preferentially oriented plane at the sputtering surface were combined is excellent in the uniformity of the film thickness distribution, and excellent in uniformity of the resistance value.

Examples 6 to 10

The Au target material was produced by using the Au billet produced similarly to Example 1 and performing the forging process similar to Example 1 except that each reduction ratio illustrated in Table 4 was applied. Next, the Au target material after the forging was subjected to the heat treatment under each condition illustrated in Table 4. After that, the Au target material after the heat treatment was subjected to the cutting process to produce the Au sputtering target having the same shape as Example 1.

TABLE 4

| | REDUCTION RATIO AT FORGING | HEAT TREATMENT CONDITION | |
| --- | --- | --- | --- |
| Au PURITY [%] | PROCESS TIME [%] | TEMPERATURE [° C.] | TIME [minutes] |
| EXAMPLE 6 | 99.99 | 80 | 500 | 20 |
| EXAMPLE 7 | 99.99 | 80 | 500 | 30 |
| EXAMPLE 8 | 99.99 | 80 | 500 | 120 |
| EXAMPLE 9 | 99.99 | 80 | 400 | 20 |
| EXAMPLE 10 | 99.99 | 80 | 300 | 20 |

The Vickers hardness of each obtained Au sputtering target was measured similarly to Example 1. Further, the average crystal grain size of each Au sputtering target was measured according to the measurement method of the plate-shaped sputtering target. As measurement results, respective average crystal grain sizes ($AD_{av1}$, $AD_{av2}$, $AD_{av3}$) of the sputtering surface, the first cross-section, and the second cross-section, an average value of these values (an average crystal grain size ($AD_{tav}$) as the whole target), and ratios of the average crystal grain sizes ($AD_{av1}$, $AD_{av2}$, $AD_{av3}$) of the respective parts with respect to the average crystal grain size ($AD_{tav}$) as the whole target are illustrated in Table 5. Further, the sputtering surface of the Au sputtering target was subjected to the X-ray diffraction, and the crystal plane which was preferentially oriented was evaluated according to the above-stated method. The orientation index N of the {110} plane was found according to the above-stated method. These results are illustrated in Table 5. The Au sputtering target as stated above was used and subjected to the deposition process similar to Example 1, and the standard deviation a of the film thickness and the standard deviation a of the resistance value of the Au film were found. These results are illustrated in Table 6.

TABLE 5

| | VICKERS HARDNESS | AVERAGE CRYSTAL GRAIN SIZE * [μm] | | | | PREFERRED CRYSTAL PLANE | ORIENTATION INDEX N OF {110} PLANE |
| --- | --- | --- | --- | --- | --- | --- | --- |
| | $HV_{tav}$ | $AD_{tav}$ | $AD_{av1}$ | $AD_{av2}$ | $AD_{av3}$ | | |
| EXAMPLE 6 | 49.8 | 35.0 | 35.2 (1.00) | 36.1 (1.03) | 33.8 (0.96) | {110} | 1.43 |
| EXAMPLE 7 | 47.5 | 36.8 | 36.2 (0.99) | 37.1 (1.01) | 36.8 (1.00) | {110} | 1.60 |
| EXAMPLE 8 | 51.2 | 38.4 | 39.1 (1.02) | 38.5 (1.00) | 37.6 (0.98) | {110} | 1.51 |
| EXAMPLE 9 | 50.2 | 34.9 | 35.2 (1.01) | 36.3 (1.04) | 33.3 (0.95) | {110} | 1.33 |
| EXAMPLE 10 | 53.2 | 34.9 | 34.6 (0.99) | 35.9 (1.03) | 34.1 (0.98) | {110} | 1.42 |
| COMPARATIVE EXAMPLE 1 | 77.3 | — | — | — | — | — | — |
| COMPARATIVE EXAMPLE 2 | 34.9 | 630.1 | 620.0 (0.98) | 637.9 (1.01) | 641.3 (1.00) | — | — |

* Each value in parentheses is a ratio with respect to $AD_{tav}$.

TABLE 6

| | DEPOSITION EVALUATION RESULT | |
| --- | --- | --- |
| | FILM THICKNESS σ | RESISTANCE VALUE σ |
| EXAMPLE 6 | 8.6 | 5.6 |
| EXAMPLE 7 | 8.1 | 4.2 |
| EXAMPLE 8 | 8.5 | 4.6 |
| EXAMPLE 9 | 9.3 | 5.9 |
| EXAMPLE 10 | 8.2 | 6.1 |
| COMPARATIVE EXAMPLE 1 | 14.0 | 10.6 |
| COMPARATIVE EXAMPLE 2 | 20.0 | 15.2 |

Examples 11 to 19, Comparative Examples 3 to 4

First, an Au nugget was inserted into a graphite crucible to be dissolved. An Au molten metal was cast into a graphite mold to produce an Au ingot. An Au billet (purity: 99.99%) with a width of 200 mm, a length of 300 mm, and a thickness of 45 mm was produced by cutting and removing a surface of the Au ingot. Next, the Au billet was hot-rolled at a temperature of 800° C. to obtain an Au target material with a width of 70 mm, a length of 200 mm, and a thickness of 45 mm. A reduction ratio at the rolling time was set to 80% as a thickness decrease rate. The Au target material after the rolling was heat treated under each condition illustrated in Table 7. The Au target material after the heat treatment was subjected to the cutting process to produce a disc-shaped Au sputtering target with a diameter of 152.4 mm and a thickness of 5 mm.

TABLE 7

| | Au PURITY [%] | REDUCTION RATIO AT ROLLING PROCESS TIME [%] | HEAT TREATMENT CONDITION TEMPERATURE [° C.] | TIME [minutes] |
|---|---|---|---|---|
| EXAMPLE 11 | 99.99 | 80 | 500 | 20 |
| EXAMPLE 12 | 99.99 | 80 | 500 | 30 |
| EXAMPLE 13 | 99.99 | 80 | 500 | 60 |
| EXAMPLE 14 | 99.99 | 80 | 500 | 90 |
| EXAMPLE 15 | 99.99 | 80 | 500 | 120 |
| EXAMPLE 16 | 99.99 | 80 | 400 | 20 |
| EXAMPLE 17 | 99.99 | 80 | 400 | 30 |
| EXAMPLE 18 | 99.99 | 80 | 300 | 20 |
| EXAMPLE 19 | 99.99 | 80 | 300 | 30 |
| COMPARATIVE EXAMPLE 3 | 99.99 | 80 | 100 | 30 |
| COMPARATIVE EXAMPLE 4 | 99.99 | 80 | 600 | 30 |

The average value of the Vickers hardness ($HV_{tav}$) as the whole target, and the average crystal grain size ($AD_{tav}$) as the whole target were measured regarding the obtained each Au sputtering target similar to Example 1. Further, the crystal plane which is preferentially oriented at the sputtering surface of the Au sputtering target was evaluated similarly to Example 1, and the orientation index N of the {110} plane was found similarly to Example 1. These results are illustrated in Table 8. These Au sputtering targets were used and subjected to the deposition process similar to Example 1, and the standard deviation σ of the film thickness and the standard deviation σ of the resistance value of each Au film were found. These results are illustrated in Table 9.

TABLE 8

| | VICKERS HARDNESS $HV_{tav}$ | AVERAGE CRYSTAL GRAIN SIZE [μm] $AD_{tav}$ | PREFERRED CRYSTAL PLANE | ORIENTATION INDEX N OF {110} PLANE |
|---|---|---|---|---|
| EXAMPLE 11 | 42.0 | 102.0 | {110} | 1.44 |
| EXAMPLE 12 | 41.8 | 101.4 | {110} | 1.46 |
| EXAMPLE 13 | 43.1 | 109.9 | {110} | 1.52 |
| EXAMPLE 14 | 42.5 | 105.4 | {110} | 1.36 |
| EXAMPLE 15 | 43.8 | 103.2 | {110} | 1.41 |
| EXAMPLE 16 | 45.0 | 103.9 | {110} | 1.54 |
| EXAMPLE 17 | 44.2 | 105.3 | {110} | 1.35 |
| EXAMPLE 18 | 41.0 | 103.1 | {110} | 1.48 |
| EXAMPLE 19 | 42.5 | 104.0 | {110} | 1.31 |
| COMPARATIVE EXAMPLE 3 | 62.8 | — | — | — |
| COMPARATIVE EXAMPLE 4 | 35.5 | 640.0 | — | — |

TABLE 9

| | DEPOSITION EVALUATION RESULT | |
|---|---|---|
| | FILM THICKNESS σ | RESISTANCE VALUE σ |
| EXAMPLE 11 | 6.5 | 4.2 |
| EXAMPLE 12 | 6.1 | 5.2 |
| EXAMPLE 13 | 5.8 | 6.2 |
| EXAMPLE 14 | 5.5 | 6.1 |
| EXAMPLE 15 | 5.1 | 5.2 |
| EXAMPLE 16 | 5.9 | 4.8 |
| EXAMPLE 17 | 6.8 | 5.8 |
| EXAMPLE 18 | 7.1 | 6.2 |
| EXAMPLE 19 | 6.2 | 5.1 |
| COMPARATIVE EXAMPLE 3 | 20.5 | 13.2 |
| COMPARATIVE EXAMPLE 4 | 28.6 | 16.5 |

Example 20

First, an Au nugget was inserted into a graphite crucible to be dissolved. An Au molten metal was cast into a graphite mold to produce an Au ingot. A cylindrical Au billet (purity: 99.99%) with an outside diameter of 100 mm, an inside diameter of 50 mm, and a length of 200 mm was produced by cutting and removing a surface of the Au ingot and performing a digging process with an inside diameter of 50 mm. Next, the cylindrical Au billet with a core material inserted in a hollow part thereof was heated to a temperature of 800° C. and hot-forged to obtain a pipe-shaped Au target material with the outside diameter of 80 mm, an inside diameter of 50 mm, and a length of 400 mm or more. A reduction ratio at the forging time was set to 35% as a thickness decrease rate. The pipe-shaped Au target material after the forging was heat treated at a temperature of 500° C. for 30 minutes. The Au target material after the heat treatment was subjected to the cutting process to produce a cylindrical Au sputtering target with an outside diameter of 70 mm, an inside diameter of 65 mm, and a length of 350 mm.

The Vickers hardness of the obtained Au sputtering target was measured according to the measurement method of the cylindrical sputtering target. The Vickers hardness at each measurement location was measured with the test force (pressing load) of 200 gf, resulting in that the average value of the Vickers hardness ($HV_{av1}$) on the first straight line of the sputtering surface was 50.6, the average value of the Vickers hardness ($HV_{av2}$) on the second straight line of the sputtering surface was 50.4, the average value of the Vickers hardness ($HV_{av3}$) at the cross-section was 52.0, and the average value of these values (the Vickers hardness ($HV_{tav}$) as the whole target) was 51.0. The ratios of the Vickers hardnesses ($HV_{av1}$, $HV_{av2}$, $HV_{av3}$) of respective parts with respect to the Vickers hardness ($HV_{tav}$) as the whole target were as follows: ($HV_{av1}/HV_{tav}$) was 0.99; ($HV_{av2}/HV_{tav}$) was 0.99; and ($HV_{av3}/HV_{tav}$) was 1.02.

Further, the average crystal grain size of the Au sputtering target was measured according to the measurement method of the cylindrical sputtering target. As a result, the average crystal grain size ($AD_{tav}$) as the whole target was 38.1 μm. The sputtering surface of the Au sputtering target was subjected to the X-ray diffraction, and the crystal plane which was preferentially oriented was evaluated according to the above-stated method. As a result, it was verified that the {110} plane of Au was preferentially oriented at the sputtering surface. When the orientation index N of the {110} plane was found according to the above-stated method, the orientation index N of the {110} plane was 1.31. The cylindrical Au sputtering target was subjected to the later-described deposition process to evaluate properties.

Examples 21 to 24, Comparative Examples 5 to 6

The Au billet produced similarly to Example 20 was used to produce each cylindrical Au target material by performing the forging process similar to Example 20 except that each reduction ratio illustrated in Table 10 was applied. Next, the Au target material after the forging was subjected to the heat treatment under each condition illustrated in Table 10. After that, the Au target material after the heat treatment was subjected to the cutting process to produce the Au sputtering target having the same shape as Example 20. The Vickers hardness, the average crystal grain size ($AD_{tav}$) of each Au sputtering target were measured similarly to Example 20. Further, the crystal plane which was preferentially oriented at the sputtering surface of the Au sputtering target was evaluated similarly to Example 20, and the orientation index N of the {110} plane was found similarly to Example 20. These results are illustrated in Table 11. The cylindrical Au sputtering target was subjected to the later-described deposition process to evaluate the properties.

TABLE 10

| | Au PURITY [%] | REDUCTION RATIO AT FORGING PROCESS TIME [%] | HEAT TREATMENT CONDITION TEMPERATURE [°C.] | TIME [minutes] |
|---|---|---|---|---|
| EXAMPLE 20 | 99.99 | 35 | 500 | 30 |
| EXAMPLE 21 | 99.99 | 35 | 500 | 60 |
| EXAMPLE 22 | 99.99 | 35 | 500 | 90 |
| EXAMPLE 23 | 99.99 | 35 | 400 | 30 |
| EXAMPLE 24 | 99.99 | 35 | 300 | 30 |
| COMPARATIVE EXAMPLE 5 | 99.99 | 35 | 100 | 30 |
| COMPARATIVE EXAMPLE 6 | 99.99 | 35 | 600 | 30 |

6-inch Si substrate (wafer) by performing the sputtering under conditions of Ar gas pressure: 0.4 Pa, input power: DC100 W, distance between target and substrate: 40 mm, sputtering time: 5 minutes. A film thickness distribution of the obtained Au film was measured according to the above-stated method, and a standard deviation σ of a film thickness of the Au film was found. In addition, a standard deviation σ of a resistance value of the Au film was found according to the above-stated method. These results are illustrated in Table 12.

TABLE 12

| | DEPOSITION EVALUATION RESULT | |
|---|---|---|
| | FILM THICKNESS σ | RESISTANCE VALUE σ |
| EXAMPLE 20 | 8.1 | 4.6 |
| EXAMPLE 21 | 8.6 | 5.1 |
| EXAMPLE 22 | 7.5 | 5.9 |
| EXAMPLE 23 | 8.5 | 4.8 |
| EXAMPLE 24 | 9.1 | 4.8 |
| COMPARATIVE EXAMPLE 5 | 20.1 | 16.4 |
| COMPARATIVE EXAMPLE 6 | 25.6 | 15.1 |

As it is obvious from Table 12, the Vickers hardness is in the range of 40 to 60 and the variation in the Vickers hardnesses at respective parts is small in each of the Au sputtering targets of Examples 20 to 24. It can be seen that the average crystal grain size is in the range of 15 to 200 µm, the {110} plane is preferentially oriented at the sputtering surface, and the orientation index N of the {110} plane is larger than 1. It can be seen that the Au film which is sputtering deposited by using the Au sputtering target where the Vickers hardness, the average crystal grain size, and the preferentially oriented plane of the sputtering surface are combined is excellent in the uniformity of the film thickness distribution, and excellent in the uniformity of the resistance value.

TABLE 11

| | VICKERS HARDNESS * | | | | AVERAGE CRYSTAL GRAIN SIZE [µm] | PREFERRED CRYSTAL PLANE | ORIENTATION INDEX N OF {110} PLANE |
|---|---|---|---|---|---|---|---|
| | $HV_{tav}$ | $HV_{av1}$ | $HV_{av2}$ | $HV_{av3}$ | $AD_{tav}$ | | |
| EXAMPLE 20 | 51.0 | 50.6 (0.99) | 50.4 (0.99) | 52.0 (1.02) | 38.1 | {110} | 1.31 |
| EXAMPLE 21 | 51.5 | 50.6 (0.98) | 51.3 (1.00) | 52.6 (1.02) | 41.2 | {110} | 1.52 |
| EXAMPLE 22 | 50.4 | 49.2 (0.98) | 51.2 (1.02) | 50.7 (1.01) | 35.1 | {110} | 1.52 |
| EXAMPLE 23 | 53.7 | 53.1 (0.99) | 54.1 (1.01) | 54.0 (1.00) | 38.6 | {110} | 1.43 |
| EXAMPLE 24 | 55.8 | 56.0 (1.00) | 55.5 (0.99) | 55.9 (1.00) | 42.8 | {110} | 1.35 |
| COMPARATIVE EXAMPLE 5 | 78.1 | 78.1 (1.00) | 77.1 (1.00) | 75.0 (0.98) | — | — | — |
| COMPARATIVE EXAMPLE 6 | 35.1 | 36.2 (1.03) | 33.8 (0.96) | 35.2 (1.00) | 509.5 | — | — |

* Each value in parentheses is a ratio with respect to $HV_{tav}$.

Each of the Au sputtering targets obtained according to the above-stated Examples 20 to 24 and Comparative examples 5 to 6 was attached to a cylindrical sputtering equipment, and after an inside of the apparatus was evacuated to $1 \times 10^{-3}$ Pa or less, an Au film was deposited on a Examples 25 to 29

The Au billet produced similarly to Example 20 was used to produce each cylindrical Au target material by performing the forging process similar to Example 20 except that each reduction ratio illustrated in Table 13 was applied. Next, the Au target material after the forging was subjected to the heat treatment under each condition illustrated in Table 13. After that, the Au target material after the heat treatment was subjected to the cutting process to produce each Au sputtering target having the same shape as Example 20.

TABLE 13

|  | Au PURITY [%] | REDUCTION RATIO AT FORGING PROCESS TIME [%] | HEAT TREATMENT CONDITION TEMPER-ATURE [° C.] | TIME [minutes] |
|---|---|---|---|---|
| EXAMPLE 25 | 99.99 | 35 | 500 | 20 |
| EXAMPLE 26 | 99.99 | 35 | 500 | 30 |
| EXAMPLE 27 | 99.99 | 35 | 500 | 120 |
| EXAMPLE 28 | 99.99 | 35 | 400 | 20 |
| EXAMPLE 29 | 99.99 | 35 | 300 | 20 |

The Vickers hardness of the obtained each Au sputtering target was measured similarly to Example 20. Further, the average crystal grain size of the Au sputtering target was measured according to the measurement method of the cylindrical sputtering target. As measurement results, average values of respective crystal grain sizes ($AD_{av1}$, $AD_{av2}$, $AD_{av3}$) of the first sputtering surface, the second sputtering surface, and the cross-section, an average value of these values (an average crystal grain size ($AD_{tav}$) as the whole target), and ratios of the average crystal grain sizes ($AD_{av1}$, $AD_{av2}$, $AD_{av3}$) of the respective parts with respect to the average crystal grain size ($AD_{tav}$) as the whole target are illustrated in Table 14. Further, the sputtering surface of the Au sputtering target was subjected to the X-ray diffraction, and the crystal plane which is preferentially oriented was evaluated according to the above-stated method, and the orientation index N of the {110} plane was found according to the above-stated method. These results are illustrated in Table 14. The Au sputtering target as stated above was used and subjected to the deposition process similar to Example 20, and the standard deviation σ of the film thickness and the standard deviation σ of the resistance value of the Au film were measured. These results are illustrated in Table 15.

TABLE 15

DEPOSITION EVALUATION RESULT

|  | FILM THICKNESS σ | RESISTANCE VALUE σ |
|---|---|---|
| EXAMPLE 25 | 8.6 | 4.1 |
| EXAMPLE 26 | 8.1 | 4.6 |
| EXAMPLE 27 | 8.5 | 4.0 |
| EXAMPLE 28 | 9.3 | 5.9 |
| EXAMPLE 29 | 8.2 | 5.7 |
| COMPARATIVE EXAMPLE 5 | 20.1 | 16.4 |
| COMPARATIVE EXAMPLE 6 | 25.6 | 15.1 |

INDUSTRIAL APPLICABILITY

The Au sputtering target of the present invention is useful for the deposition of the Au film used for various uses. By performing the sputtering by using the Au sputtering target of the present invention, the Au film excellent in uniformity of a film thickness distribution and resistance value can be obtained. Accordingly, properties of the Au film used for various uses can be increased.

What is claimed is:
1. A gold sputtering target which is made of gold and inevitable impurities, has a gold purity of 99.99% or more, is plate-shaped or cylindrical and has a surface to be sputtered, wherein
  an average value of Vickers hardness is 40 or more and 60 or less,
  an average crystal grain size is 15 μm or more and 200 μm or less,
  a {110} plane of gold is preferentially oriented at the surface to be sputtered, and wherein the surface to be sputtered is subjected to X-ray diffraction, and an orientation index N of each crystal plane is found from the following expression (1) by using a diffraction intensity ratio of each crystal plane of gold, the orientation index N of the {110} plane of gold is larger than 1, and the largest among the orientation indexes N of all crystal planes,

TABLE 14

|  | VICKERS HARDNESS | AVERAGE CRYSTAL GRAIN SIZE * [μm] | | | PREFERRED CRYSTAL | ORIENTATION INDEX N OF |
|---|---|---|---|---|---|---|
|  | $HV_{tav}$ | $AD_{tav}$ | $AD_{av1}$ | $AD_{av2}$ | $AD_{av3}$ | PLANE | {110} PLANE |
| EXAMPLE 25 | 52.8 | 103.1 | 101.2 (0.98) | 102.6 (0.99) | 105.6 (1.02) | {110} | 1.55 |
| EXAMPLE 26 | 51.2 | 108.1 | 105.3 (0.99) | 104.6 (0.99) | 108.1 (1.02) | {110} | 1.35 |
| EXAMPLE 27 | 49.3 | 109.8 | 109.2 (0.99) | 110.2 (1.00) | 110.1 (1.00) | {110} | 1.42 |
| EXAMPLE 28 | 54.6 | 106.1 | 102.2 (0.98) | 104.1 (1.00) | 106.1 (1.02) | {110} | 1.51 |
| EXAMPLE 29 | 55.5 | 103.2 | 103.2 (1.00) | 105.2 (1.02) | 101.1 (0.98) | {110} | 1.48 |
| COMPARATIVE EXAMPLE 5 | 78.1 | — | — | — | — | — | — |
| COMPARATIVE EXAMPLE 6 | 35.1 | 509.5 | 510.2 (1.00) | 506.2 (0.99) | 512.0 (1.00) | — | — |

* Each value in parentheses is a ratio with respect to $AD_{tav}$.

$$N = \left( \frac{\frac{I/I_{(hkl)}}{\Sigma(I/I_{(hkl)})}}{\frac{JCPDS \cdot I/I_{(hkl)}}{\Sigma(JCPDS \cdot I/I_{(hkl)})}} \right) \quad (1)$$

wherein $I/I_{(hkl)}$ is the diffraction intensity ratio of an (hkl) plane in the X-ray diffraction, $JCPDS \cdot I/I_{(hkl)}$ is the diffraction intensity ratio of the (hkl) plane at a JCPDS card, $\Sigma(I/I_{(hkl)})$ is a sum of the diffraction intensity ratios of all crystal planes in the X-ray diffraction, and $\Sigma(JCPDS \cdot I/I_{(hkl)})$ is a sum of the diffraction intensity ratios of all crystal planes at the JCPDS card.

2. The gold sputtering target according to claim 1, wherein the Vickers hardness of the gold sputtering target as a whole falls within ±20%.

3. The gold sputtering target according to claim 1, wherein the average crystal grain size of the gold sputtering target as a whole falls within ±20%.

4. The gold sputtering target according to claim 1, wherein the gold sputtering target has a plate shape.

5. The gold sputtering target according to claim 1, wherein the gold sputtering target has a cylindrical shape.

6. The gold sputtering target according to claim 1, wherein an average value of the Vickers hardness ($HV_{tav}$) of the plate-shaped gold sputtering target is an average value of: an average value of the Vickers hardness ($HV_{av1}$) of the surface to be sputtered; an average value of the Vickers hardness ($HV_{av2}$) on the first cross-section orthogonal to the surface to be sputtered; and an average value of the Vickers hardness ($HV_{av3}$) on a second cross-section perpendicular to the first cross-section, and an average value of the Vickers hardness ($HV_{tav}$) of the cylindrical gold sputtering target is an average value of: an average value of the Vickers hardness ($HV_{av1}$) on an arbitrary first straight line parallel to a cylinder axis of the surface to be sputtered; an average value of the Vickers hardness ($HV_{av2}$) on a second straight line rotated by 90° from the first straight line; and an average value of the Vickers hardness ($HV_{av3}$) of the cross section orthogonal to the cylinder axis.

7. The gold sputtering target according to claim 1, wherein an average value of the average crystal grain size ($AD_{tav}$) of the plate-shaped gold sputtering target is an average value of: an average value of the average crystal grain size ($AD_{av1}$) on the surface to be sputtered; an average value of the average crystal grain size ($AD_{Av2}$) on a first cross-section orthogonal to the surface to be sputtered; and an average value of the surface to be sputtered; and the average value of the average crystal grain size ($AD_{Av3}$) on a second cross-section at right angle to the surface to be sputtered and the first cross-section, and the average value of the average crystal grain size ($AD_{tav}$) of the cylindrical gold sputtering target is an average value of: the average value of the average crystal grain size ($AD_{av1}$) on an arbitrary first straight line parallel to a cylinder axis on the surface to be sputtered; the average value of the average crystal grain size ($AD_{av2}$) on a second straight line rotated by 90° from the first straight line; and the average value of the average crystal grain size ($AD_{Av3}$) on a cross-section orthogonal to the cylinder axis.

\* \* \* \* \*